United States Patent [19]

Shiue et al.

[11] Patent Number: 5,781,445

[45] Date of Patent: Jul. 14, 1998

[54] PLASMA DAMAGE MONITOR

[75] Inventors: Ruey-Yun Shiue, Hsin-Chu; Sung-Mu Hsu, I-Lan, both of Taiwan

[73] Assignee: Taiwan Semiconductor Manufacturing Company, Ltd., Hsin-Chu, Taiwan

[21] Appl. No.: 701,361

[22] Filed: Aug. 22, 1996

[51] Int. Cl.$^6$ .................. H01L 21/02; H01L 21/8249
[52] U.S. Cl. .................. 364/481; 702/108; 257/347; 257/754; 438/9; 438/14
[58] Field of Search .................. 364/481, 556, 364/550, 551.01; 257/700, 701, 734, 751, 754, 755, 347, 200; 324/750, 754, 765, 769; 438/9, 5, 6, 14

[56] References Cited

U.S. PATENT DOCUMENTS

| | | | |
|---|---|---|---|
| 3,882,391 | 5/1975 | Liles et al. | 324/769 |
| 4,994,735 | 2/1991 | Leedy | 324/754 |
| 5,079,617 | 1/1992 | Yoneda | 257/755 |
| 5,134,083 | 7/1992 | Matthews | 438/234 |
| 5,266,835 | 11/1993 | Kulkarni | 257/751 |
| 5,310,703 | 5/1994 | Visser et al. | 438/725 |
| 5,444,637 | 8/1995 | Smesny et al. | 364/556 |
| 5,451,798 | 9/1995 | Tsuda et al. | 257/139 |
| 5,512,514 | 4/1996 | Lee | 148/DIG. 106 |
| 5,596,207 | 1/1997 | Krishnan et al. | 257/48 |
| 5,604,371 | 2/1997 | Kimura et al. | 257/378 |
| 5,638,006 | 6/1997 | Nariani et al. | 324/765 |
| 5,650,651 | 7/1997 | Bui | 257/355 |

OTHER PUBLICATIONS

S. Wolf, "Silicon Processing for the VLSI Era, vol. 3", Lattice Press, Sunset Beach, CA, pp. 507–509.

*Primary Examiner*—Emanuel Todd Voeltz
*Assistant Examiner*—Demetra R. Smith
*Attorney, Agent, or Firm*—George O. Saile; Stephen B. Ackerman

[57] ABSTRACT

A test structure is described which indicates the occurrence of plasma damage resulting from back-end-of-line processing of integrated circuits. The structure consists of a MOSFET which is surrounded by a conductive shield grounded to the substrate silicon along its base perimeter. The walls of the shield are formed from the sundry levels of conductive layers applied during the integrated circuit interconnection metallization beginning with contact metallurgy which is connected to a diffusion within the substrate. This diffusion is formed within a trench in field oxide surrounding the MOSFET and is of the same conductive type as the substrate material. The top conductive plate of the test structure is formed from a selected metallization layer of the integrated circuit. By forming test structures with top conductive plates formed from two different metallization levels, the plasma damage incurred during the intervening processing steps can be uniquely determined. The test structures may be formed within the wafer saw-kerf area or within wafer test sites. Testing is accomplished by measuring shifts in threshold voltage and drive current before and after gate current stressing. Differences in these shifts from one metallization level to another indicate damage in the MOSFETs gate region has occurred during the processing steps which lie between the depositions of the top conductive plates of the two shields.

22 Claims, 3 Drawing Sheets

PLASMA DAMAGE MONITOR

BACKGROUND OF THE INVENTION

(1) Field of the Invention

This invention relates to testing and diagnostics of line processes used for the manufacture of integrated circuit devices and more particularly to the measurement and monitoring of plasma damage from back-end-of-line processes.

(2) Description of Prior Art

The manufacture of large scale integrated circuits in a mass production facility involves hundreds of discrete processing steps beginning with the introduction of blank semiconductor wafers at one end and recovering the completed chips at the other. The manufacturing process is usually conceived as consisting of the segment wherein the semiconductor devices are formed within the silicon surface (front-end-of-line) and the portion which includes the formation of the various layers of interconnection metallurgy above the silicon surface(back-end-of-line). Most of these processing steps involve depositing layers of material, patterning them by photolithographic techniques, and etching away the unwanted portions. The materials consist primarily of insulators and metal alloys. In some instances the patterned layers serve as temporary protective masks. In others they are the functional components of the integrated circuit chip.

Radio-frequency(rf) plasmas are used extensively in many of these processing steps, in particularly for back-end-of-line. Their usefulness stems from the fact that they are dry processes and they provide the cleanliness and the dimensional and compositional control required in integrated circuit manufacture.

Reactive-ion-etching(RIE) provides the etching anisotropy required to achieve a high degree of pattern definition and precise dimensional control. Here the gaseous chemical etching is assisted by unidirectional ion bombardment provided by an rf plasma. Plasma etching, which is accomplished at higher pressures, is isotropic. Photoresist layers too, are frequently removed, not by chemical solvents, but more cleanly by plasma ashing.

The unfortunate consequences of these numerous exposures of semiconductor wafers to rf plasmas and other forms of ionic radiation, is the occurrence of radiation damage and the accumulation of charge on exposed conductive components which leads to damaging current flows and trapped charge affecting the semiconductor devices.

The most important semiconductor device in current technology is the metal-oxide-silicon-field-effect-transistor (MOSFET). It is a simple device consisting of two shallow regions of one type semiconductor—the source and the drain—separated by a region of another type. The conductivity of the central region(channel) is modulated by applying a voltage to an electrode(gate) which overlies the channel region and is separated from it by a thin insulating layer(gate oxide). CMOS(complementary MOS) technology utilizes MOSFETS in pairs, one an n-type channel device (NMOS) and the other a p-type channel device(PMOS). The simple nature of these devices and their minimal heat dissipation permits an extraordinary degree of miniaturization and consequently a high density of circuits. The gate electrode is no longer made of metal but of heavily doped polysilicon. In the late 1980s the design rule for these devices was 3.5 microns. Todays design rules are approaching 0.25 microns.

The gate insulating layer which overlies the channel region usually consists of thermally grown silicon oxide and is one of the most critical components of the MOSFET. For the 3.5 micron technology this silicon oxide layer is about 600 Angstroms thick. The 0.25 micron design rule requires it to be of the order of only 70 Angstroms. An insulating film of these dimensions it highly susceptible to damage from external sources during manufacture. A prominent cause of such damage is ion and electron bombardment from plasmas used in the back-end-of-line processing. The surfaces of patterned semiconductor wafers located within a plasma reactor present multiple areas of conductors and insulators to the plasma. These produce local non-uniformities in the plasma currents which result in charge build-up on the electrically floating conductor surfaces.

After the gate oxide layer is formed it is covered with a layer of polysilicon within which the gate electrode is defined. The etching of this polysilicon layer is accomplished by reactive-ion-etching, providing the first in a series of exposures of the gate oxide to an rf plasma. In this instance the area of the gate electrode is covered with photoresist. As etching proceeds the exposed polysilicon provides sufficient conduction to prevent local charge build-up. However, as the endpoint is approached, the polysilicon layer breaks up and residual, now isolated, regions of polysilicon surrounding the photoresist protected gate electrode act as an antenna which accumulate positive charge. This results in the development of a positive potential sufficiently high to cause current flow through the gate oxide. These polysilicon halos can present a high antenna-to-thin oxide area ratio causing massive current flow in the oxide. As etching proceeds, the halos of polysilicon disappear and the antenna area is reduced to the thin edges of the gate electrode itself.

Subsequent sundry processing steps provide multiple exposures of the gate oxide to damage by plasmas and ionizing radiation. The nature of the exposure and the avenues available for reducing it are different and are unique to each processing step.

The mechanism of current flow though the gate oxide is primarily Fowler-Nordheim(FN) tunneling. FN tunneling occurs at fields in excess of 10MV/cm. Charge build up on the gate electrode resulting in a gate electrode potential of only 10 volts is therefore sufficient to induce FN tunneling through an oxide layer of 100 Angstroms. Such potentials are easily achieved in conventional plasma reactors. Excessive FN tunneling currents eventually lead to positively charged interface traps in the oxide and subsequent dielectric breakdown.

The multiple exposures of the gate oxide to steps involving plasmas has led to the emergence of several test structures designed to amplify the charging exposure and thereby allow proper and timely assessment of the damage delivered by the sundry plasma processing steps (See Wolf, S., *Silicon Processing for the VLSI Era*, Vol3, Lattice Press, Sunset Beach, Calif., Vol.3 (1995),p507-9). These test structures fall into two types: 1) Antenna structures which have large areas of conductor exposed to the plasma as compared to the area of the gate oxide; and 2) large area capacitors which are formed over the gate oxide. These test structures indicate the presence or absence of radiation damage but are not able to adequately pinpoint the processing steps responsible for the damage. In addition they frequently produce ambiguous results because their status at time-of-measurement time does not necessarily reflect previous events.

Test structures are typically formed within specifically designated test sites or within the saw-kerf of the silicon wafer. In some instances, for example Smesny U.S. Pat. No. 5,444,637, entire wafers are devoted to provide a plurality of test structures for process monitoring.

SUMMARY OF THE INVENTION

It is an object of this invention to describe a design for test structures which are capable of sensing and recording semiconductor device damage caused by ionizing radiation or electron bombardment during back-end-of-line processing steps. Such radiation or bombardment damage is incurred during plasma processing steps as RIE, plasma etching, plasma deposition, plasma ashing, ion milling, and sputtering.

It is a further object of this invention to provide for a plurality of different test structures, each having a unique capability of sensing and recording device damage incurred within a discrete sub-group of processing steps, thereby localizing the causes of the damage.

These objects are accomplished by test structures consisting of a shielded MOSFET formed by conventional processing techniques. The test structure is formed, either within the wafer saw-kerf or within a designated test site. The MOSFETs may be provided with parallel capacitors to share the radiation damage.

A full metal shield encompasses each MOSFET test device. The shield cover is formed from the material deposited as one of the integrated circuit's metallization layers. The shield is grounded around its periphery to a conductive wall which surrounds the MOSFET and is built up over, and in contact with, an implant of the same conductivity type as the well in which the device resides. The MOSFET is protected from damage by processing steps subsequent to the deposition of the shield cover. The shield cover may be formed by any one of several metallization levels used for the integrated circuit being built. An integrated circuit having three levels of interconnection metallurgy, for example, would have three types of plasma damage monitoring devices, each having a shield formed from a different metallization level. The differences in radiation damage incurred by devices with successive metal shields is caused by the processing steps between those levels.

The fabrication of the test structures of this invention are completely compatible and consistent with any standard CMOS manufacturing process. Testing is accomplished by measuring shifts in threshold voltage and drive-saturation-current with and without gate current stressing.

DESCRIPTION OF THE PREFERRED EMBODIMENTS

Figure 1:
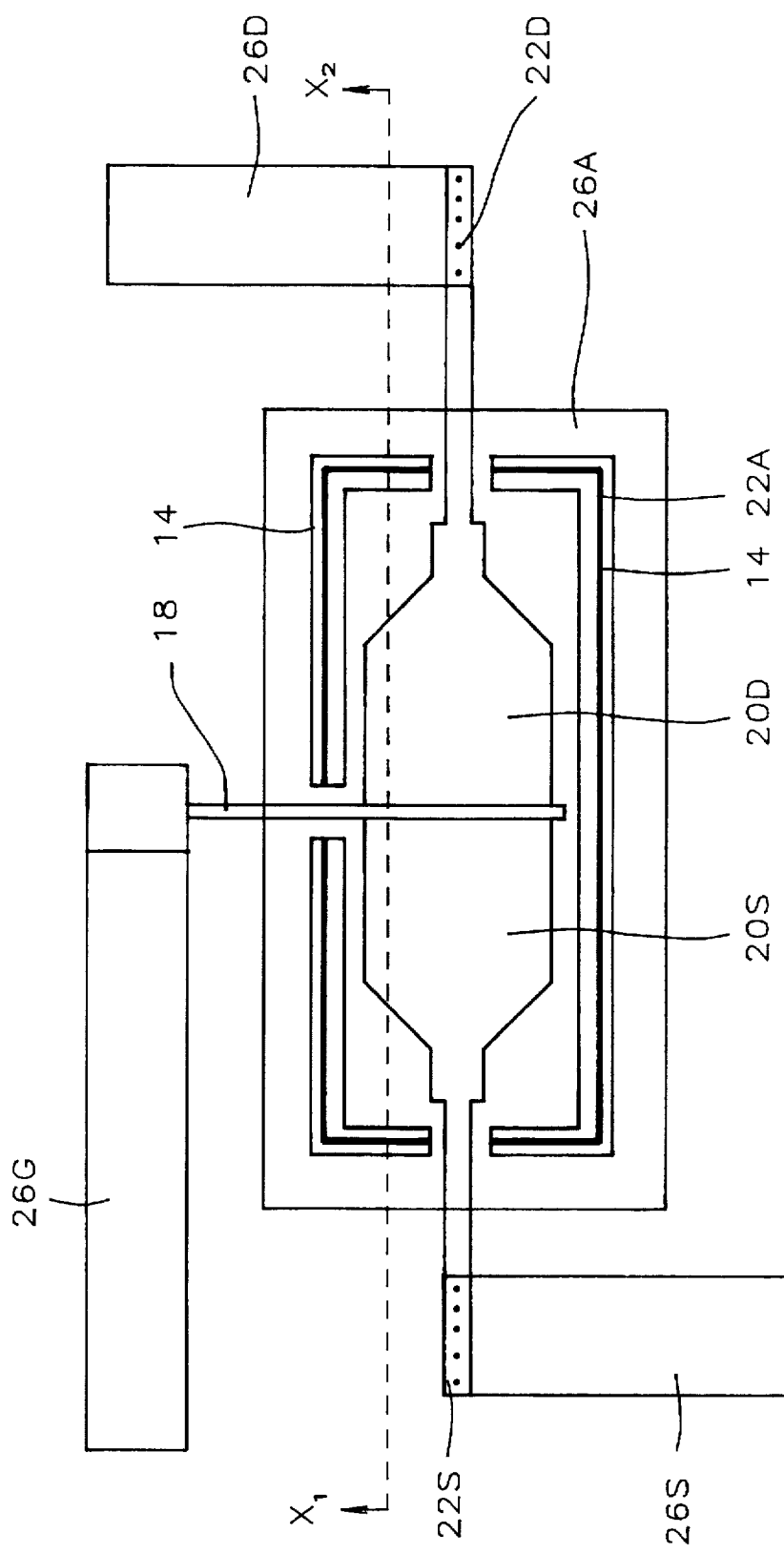
FIG. 1 is a top view of the plasma damage test structure.
Figure 2:
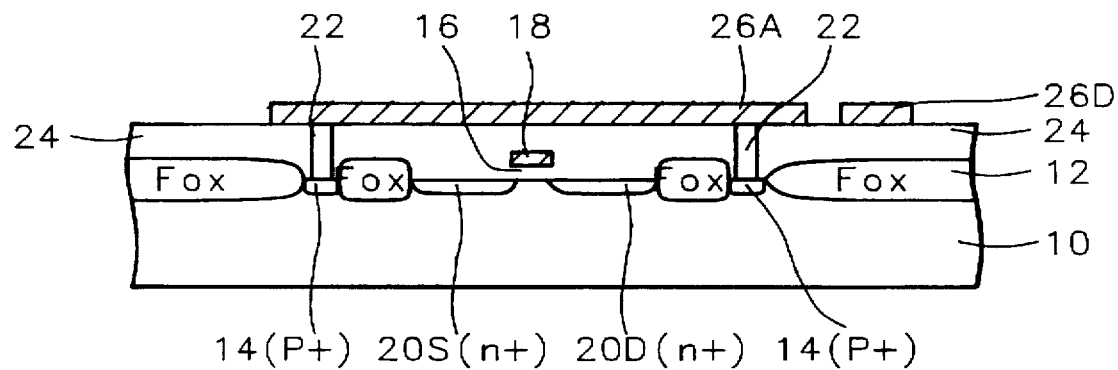
FIG. 2 is a cross-section of a plasma damage test structure formed according to the first embodiment of this invention.
Figure 3:
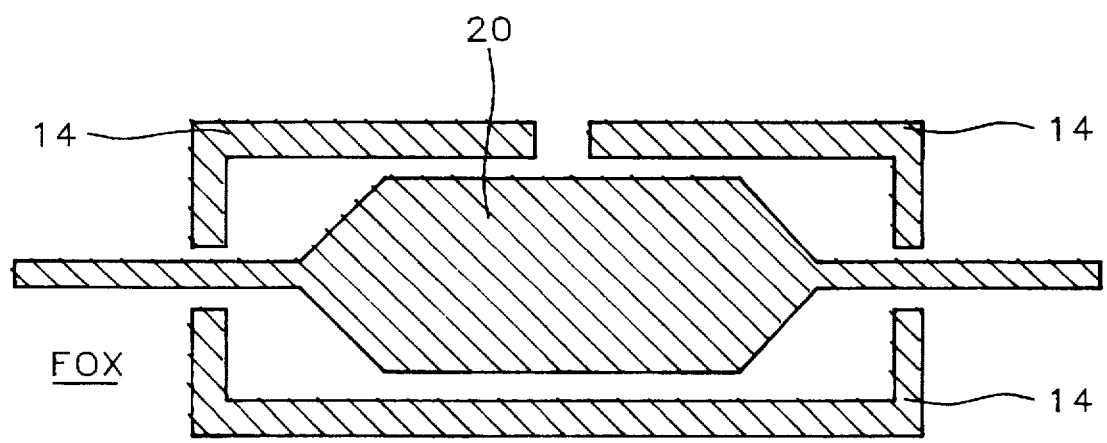
FIG. 3 is a top view of the plasma damage test structure showing the exposed silicon surface after the field oxide isolation has been formed.

Referring to FIGS. 1 through 3 there are shown three views of a first embodiment of this invention. The metal I plasma damage monitor device depicted by this embodiment has its top shield cover formed from the first metallization layer of the integrated circuit. FIG. 1 is a top view of the test structure. In order to more easily visualize the structure of the test device, FIG. 2, which shows a cross section of the region designated by the line X1–X2 in FIG. 1, should be viewed simultaneously. An additional aid is provided by FIG. 3 which shows the silicon active area used by the test structure. The hatched regions in FIG. 3 represent available silicon areas defined as openings in an overall region of field oxide isolation(FOX). The field oxide is formed by the local oxidation of silicon(LOCOS), a procedure well known by those versed in the art. The regions 14 form the shield contacts while the region 20 forms the active areas (FIG. 1 and 2) of the MOSFET. The source and drain active regions of the MOSFET are shown as 20S and 20D (FIG. 1 and 2) respectively.

The MOSFET described in this embodiment is an n-channel device(NMOS) and is constructed in either a p-well or directly in a p-type silicon wafer. The polysilicon gate 18 traverses between these regions and over the gate oxide 16. A rectangular active region 14 surrounds the active region of the MOSFET and is isolated from it by field oxide. This region is later implanted with a p-type dopant such as boron to form the grounding contact for the shield to the substrate 10. The regions 20S and 20D are formed by ion implantation with an n-type dopant such as phosphorous or arsenic using the polysilicon gate 18 to mask the gate region 16 by standard procedures well known to those familiar to self-aligned polysilicon gate technology. The regions 14 are protected from this implant by a photoresist mask. This same photoresist mask also protects the active regions of the p-channel devices(PMOS) of the CMOS integrated circuits.

After the implantation of n-type dopant into the NMOS active areas, conventional CMOS processing provides for the masking of the NMOS devices and exposing the PMOS active areas to a boron implantation. During this processing, the test structure's MOSFET is are protected with photoresist and the shield grounding regions 14 are exposed and implanted with boron to form the silicon ground contacts.

After the silicon active areas have been implanted an interlevel dielectric layer(ILD) 24 is deposited and planarized. Contact openings 22 are patterned into this layer and a contact metallurgy is applied to fill these openings. In this embodiment a tungsten plug metallurgy is used. This metallurgy forms the walls of the shield 22A as well as the contacts to the source 22S and drain 22D regions of the MOSFET. A metallization layer of an aluminum/copper alloy is deposited and patterned to form the top cover 26A of the shield and the wiring stripes 26S, 26D, and 26G to the source 20S, drain 20D, and gate 18 respectively of the MOSFET. Conduction paths connecting the stripes 26S, 26D, and 26G to their respective probe pads are provided according to conventional interconnection design familiar to those versed in the art.

The patterning of the top cover of the shield completes the formation of a metal I plasma damage monitor. The metal encapsulation and its grounding to the substrate protects the channel region and the gate oxide of the enclosed MOSFET from ion bombardment, radiation, and electron charging except as might occur through exposure of the gate electrode 26G.

The metal I plasma damage monitor described in the first embodiment is designed to be used in conjunction with similar plasma damage monitors formed with top covers of other metallization levels.

Figure 4:
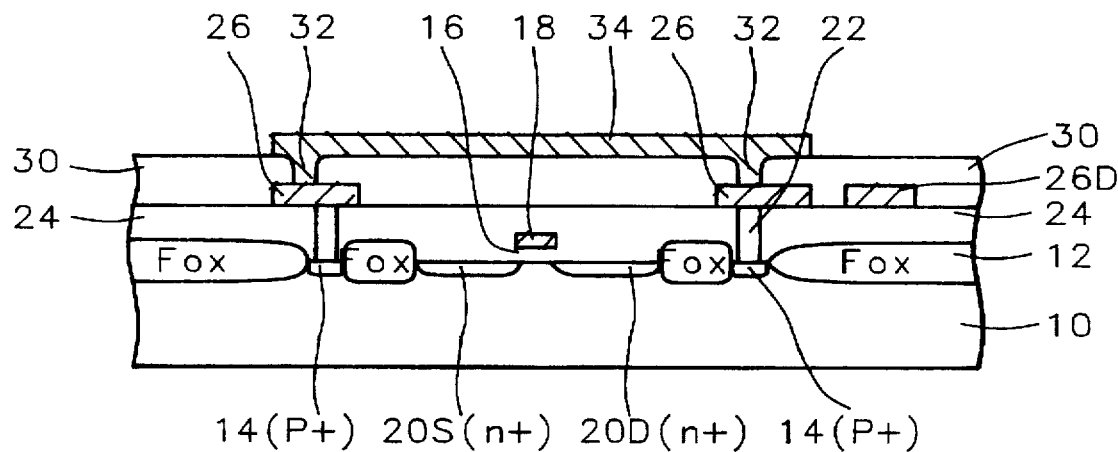
FIG. 4 is a cross-section of a plasma damage test structure formed according to the second embodiment of this invention.

In a second embodiment, a metal 11 plasma damage monitor is described by extending the construction of the first embodiment to a second layer of metallization. FIG. 4 shows a construction similar to that of the metal I plasma monitor except that the first metallization layer 26 does not form the top cover of the shield. Instead it provides an extension of the shield wall through an intermetal-dielectric (IMD) layer 30 to a second metallization layer 34 which now forms the top cover of the shield. Processing steps involving potential damage to the MOSFET now include the patterning RIE of the metallization layer 26, the RIE of the vias 32, and other radiation exposures such as RIE etch-back of the IMD layer 30 which is often used as a planarization step.

Higher level damage monitors involving third and fourth levels of metallization are similarly formed as extensions of the second embodiment. In each case the top cover of the shield is formed by the appropriate metallization level. Each higher level monitor will serve to report damage incurred in the processing steps between its shield formation and the metal level immediately below.

Placement of the plasma damage monitor test structures can be either in the wafer saw-kerf, within specially designed test site chips, on special test wafers or within the product chips themselves. The choice of location depends upon the severity of damage problems and the maturity of the process itself. For pilot line and development operations, the use of special wafer test sites is favored. These can provide sufficient devices for process modeling and optimization. In addition, wafer testing capability is more extensive since the diced test sites can be subjected to more extensive stress testing than is possible on kerf devices.

For mature processes where wafer real estate is at a premium, these damage monitor devices are more appropriately placed in the wafer saw-kerf. Measurements of threshold voltage shift and saturation current shift are made before and after the application of a gate current stress on the MOSFET.

Process damage monitors for each level of metallization are included within the locations chosen. In addition unshielded MOSFETS are also provided for reference purposes. In addition some process damage monitors may be provided with parallel gate capacitors which share the charging damage with the MOSFET.

A typical testing sequence is as follows:
1. Measure an initial threshold voltage ($V_{th0}$) and drive-saturation-current($I_{dsat0}$).
2. Apply gate stress($I_g$).
3. Measure a final threshold voltage($V_{th1}$) and drive-saturation current($I_{dsat1}$).
4. Compute threshold voltage shift($\Delta V_{th}$) and $I_{dsat}$ shift ($\Delta I_{dsat}$).
5. Repeat steps 1 through 4 for each process damage monitor including unshielded reference devices.

Figure 5:
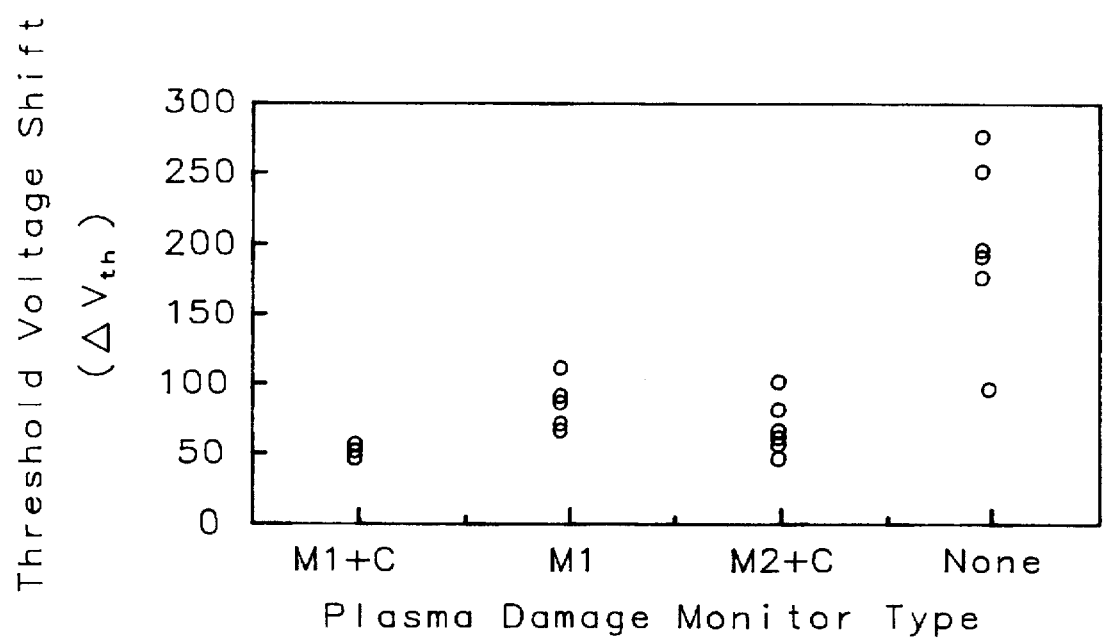
FIG. 5 is a plot of threshold voltage shift of plasma damage monitors having top shield cover plates formed from first and second metallization levels.

FIG. 5 shows test results on process damage monitors representing two levels of metallization. The M1 structure was formed according to the first embodiment and the M2 structure was formed according to the second embodiment. Some process damage monitors were provided with parallel gate capacitors. The figure shows the threshold voltage shift ($\Delta V_{th}$). The reference, unshielded devices, labeled "None" show the most degradation and scatter. The channel regions of these devices were subjected to the full complement of back-end-of-line plasma processing steps. The devices in the group labeled M1+C Have their shields formed with first metal and have parallel gate capacitors. These MOSFETS are protected from damage by plasma processing steps occurring subsequent to the first metal deposition. When no parallel capacitor is provided, the MOSFET gate region sustains slightly more damage as in shown by the data labeled M1.

Finally, the data labeled M2+C represents process damage monitors having a top shield cover formed from a second metallization layer according to the second embodiment, and also provided with a parallel gate capacitor. Comparing this threshold voltage shift with that of M1+C, it is clear that the plasma processing steps occurring between first metal deposition and second metal deposition have imparted a measurable amount of damage to the channel region. These processing steps include first metal patterning etch, plasma deposition of an ILD layer, any planarization RIE etch-back, any photoresist ashing, and any damage induced during second metal deposition. Electron charging of the gate electrode such as might be incurred during scanning electron microscopic examination could also contribute to gate oxide damage.

The difference in damage between M2+C and the unshielded reference devices shows that the etching of vias and processing steps above the second metal layer contribute to the gate oxide damage. A plot of the corresponding drive-saturation-current($I_{dsat0}$) for these devices is similar to FIG. 5.

The embodiments just described and illustrated by FIG. 1 through 5 use a p-type substrate. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated.

While the invention has been particularly shown and described with reference to the preferred embodiments thereof, it will be understood by those skilled in the art that various changes in form and details may be made without departing from the spirit and scope of the invention.

What is claimed is:

1. A structure formed on a silicon substrate to measure and monitor damage to MOSFET gate insulation incurred during manufacturing processes involving exposure to plasmas comprising:

a MOSFET surrounded laterally by a field oxide(FOX) formed on a silicon wafer;

a conductive wall forming a continuous perimeter around said MOSFET insulated therefrom by said field oxide, and having three openings to allow insulated passage of component leads of said MOSFET through said conductive wall, said conductive wall further being ohmically grounded at all points along its base to said silicon wafer; and a top conductive plate over said MOSFET, insulated therefrom, and electrically attached at all points along its edges to the top perimeter of said conductive wall thereby forming, with said conductive wall, an inverted box enclosure which forms a full metal shield over said MOSFET, said box enclosure being continuous and having no internal boundaries except for said three openings.

2. The structure of claim 1 wherein the conductive wall is grounded to the silicon substrate at every point along its base though a diffusion in a trench in said field oxide which forms the base of the conductive wall.

3. The structure of claim 2 wherein the diffusion is of the same conductivity type as the conductivity type of the silicon substrate.

4. The structure of claim 1 wherein the component leads of said MOSFET are the source drain, and the gate electrode.

5. The structure of claim 1 wherein said component leads of said MOSFET are insulated from said conductive wall by said field oxide and by dielectric layers and are connected to external probe pads for electrical testing.

6. The structure of claim 2 wherein the bottom portion of the conductive wall is formed by tungsten contact metallurgy in contact with said diffusion.

7. The structure of claim 1 wherein the top conductive plate is formed from a layer of deposited metal.

8. A structure formed on a silicon substrate having integrated circuits to measure and monitor damage to MOSFET gate insulation incurred during back-end-off-line processing steps involving exposure to plasmas comprising:

a MOSFET formed on a silicon wafer surrounded laterally by a field oxide;

a conductive wall forming a continuous perimeter around said MOSFET, insulated therefrom, and having three openings to allow insulated passage of component leads from said MOSFET through said conductive wall said conductive wall further being ohmically grounded at all points along its base to said silicon wafer; and a top conductive plate over said MOSFET, insulated therefrom, and electrically attached at all points along its edges to the top perimeter of said conductive wall thereby forming, with said conductive wall, an inverted box enclosure which forms a full metal shield over said MOSFET, said box enclosure being continuous and having no internal boundaries except for said three openings.

9. The structure of claim 8 wherein the conductive wall is grounded to the silicon substrate at every point along its base though a diffusion in a trench in said field oxide which forms the base of the conductive wall.

10. The structure of claim 9 wherein the diffusion is of the same conductivity type as the conductivity type of the silicon substrate.

11. The structure of claim 8 wherein the lower portion of said conductive wall is formed by tungsten contact metallurgy in contact with said diffusion.

12. The structure of claim 8 wherein the top conductive plate is formed from a first metallization layer which forms a first interconnection wiring layer of the integrated circuits.

13. The structure of claim 8 wherein the component leads of said MOSFET are the source, drain, and the gate electrode.

14. The structure of claim 8 wherein said component leads of said MOSFET are insulated from said conductive wall by said field oxide and by dielectric layers and are connected to external probe pads for electrical testing.

15. The structure of claim 8 wherein the bottom portion of the conductive wall is formed with tungsten contact metallurgy.

16. The structure of claim 15 wherein the upper portion of the conductive wall is formed from a first metallization layer and a first via.

17. The structure of claim 15 wherein the top conductive plate is formed from a second metallization layer which forms a second interconnection wiring layer of the integrated circuits.

18. The structure of claim 15 wherein the upper portion of the conductive wall is formed from a first metallization layer, a first via, a second metallization layer and a second via.

19. The structure of claim 18 wherein the top conductive plate is formed from a third metallization layer which forms a third interconnection wiring layer of the integrated circuits.

20. The structure of claim 15 wherein the upper portion of the conductive wall is formed from a first metallization layer, a first via, a second metallization layer, a second via, a third metallization layer and a third via.

21. The structure of claim 20 wherein the top conductive plate is formed from a fourth metallization layer which forms a fourth interconnection wiring layer of the integrated circuits.

22. A method of testing shielded MOSFET test structures for damage incurred during plasma processing comprising;

providing a first shielded MOSFET test structure formed on a silicon substrate, said test structure comprising a first MOSFET surrounded and insulated from a first conductive wall which forms a continuous perimeter around said first MOSFET, said first conductive wall further being ohmically grounded to said silicon substrate at all points along its base and having a first continuous top conductive plate with no internal boundaries formed from a first level of metallization, said first top conductive plate contacting all points along the top of said first conductive wall except for a first set of three openings wherethrough component leads from source, drain, and gate elements of said first MOSFET pass through and are insulated from said first conductive wall terminating at a first set of test pads;

connecting test probes to said first set of test pads and to a substrate ground;

measuring a first pre-stress value of threshold voltage and a first prestress value of drive-saturation-current;

applying a first gate current stress;

measuring a first post-stress value of threshold voltage and a first post-stress value of drive-saturation-current;

computing a first threshold voltage shift and a first drive-saturation-current shift by subtracting the respective first pre-stress values from the first post-stress values;

providing a second fully shielded MOSFET test structure formed on a silicon substrate, said test structure comprising a second MOSFET surrounded and insulated from a second conductive wall which forms a continuous perimeter around said second MOSFET, said second conductive wall further being ohmically grounded to said silicon substrate at all points along its base and having a second continuous top conductive plate with no internal boundaries formed from a second level of metallization, said second top conductive plate contacting all points along the top of said second conductive wall except for a second set of three openings wherethrough component leads from source, drain, and gate elements of said second MOSFET pass through and are insulated from said second conductive wall terminating at a second set of test pads; connecting test probes to said second set of test pads and to a substrate ground;

measuring a second pre-stress value of threshold voltage and a second pre-stress value of drive-saturation-current;

applying a second gate current stress;

measuring a second post-stress value of threshold voltage and a second post-stress value of drive-saturation-current;

computing a second threshold voltage shift and a second drive-saturation-current shift by subtracting the respective second pre-stress values from the second post-stress values; and comparing said second threshold voltage shift with said first threshold voltage shift and said second drive-saturation-current shift with said first drive-saturation-current shift, an increase in either quantity indicating plasma damage has occurred during the intervening processing steps between the formation of the top conductive plates of the first and second shielded MOSFETs.

* * * * *